United States Patent [19]
Ozawa et al.

[11] Patent Number: 5,474,410
[45] Date of Patent: Dec. 12, 1995

[54] MULTI-CHAMBER SYSTEM PROVIDED WITH CARRIER UNITS

[75] Inventors: Masahito Ozawa; Masami Mizukami, both of Yamanashi; Masanobu Kanazashi, Kofu; Toshihiko Takasoe, Yamanashi; Masaki Narushima, Yamanashi; Masao Kubodera, Yamanashi, all of Japan

[73] Assignee: Tel-Varian Limited, Nirasaki, Japan

[21] Appl. No.: 212,821

[22] Filed: Mar. 14, 1994

[30] Foreign Application Priority Data

Mar. 14, 1993 [JP] Japan ..................... 5-078916
Apr. 28, 1993 [JP] Japan ..................... 5-125220

[51] Int. Cl.⁶ ..................... B65G 1/06
[52] U.S. Cl. ..................... 414/217; 414/936; 414/939; 414/940; 414/937; 414/416; 414/754; 414/744.2; 118/719; 901/47
[58] Field of Search ............. 414/917, 744.2, 414/744.6, 744.8, 935, 936, 937, 939, 940, 941, 416, 222, 225, 217, 754, 757; 204/298.25; 118/719; 901/47, 46; 364/478, 559

[56] References Cited

U.S. PATENT DOCUMENTS

| | | | |
|---|---|---|---|
| 4,917,556 | 4/1990 | Stark et al. | 414/939 X |
| 4,951,601 | 8/1990 | Maydan et al. | 414/939 X |
| 4,954,079 | 9/1990 | Yamaga | 414/940 X |
| 5,085,553 | 2/1992 | Boowens et al. | 414/416 X |
| 5,135,608 | 8/1992 | Okutani | 414/937 X |
| 5,186,594 | 2/1993 | Toshima et al. | 414/416 X |
| 5,310,410 | 5/1994 | Begin et al. | 414/939 X |
| 5,333,986 | 8/1994 | Mizukami et al. | 414/939 |
| 5,340,261 | 8/1994 | Oosawa et al. | 414/939 X |
| 5,374,147 | 12/1994 | Hiroki et al. | 414/936 X |

FOREIGN PATENT DOCUMENTS

| | | | |
|---|---|---|---|
| 95844 | 5/1987 | Japan | 414/936 |
| 288460 | 12/1991 | Japan | 414/940 |
| 154146 | 5/1992 | Japan | 414/936 |
| 13549 | 1/1993 | Japan | 414/939 |

*Primary Examiner*—Frank E. Werner
*Attorney, Agent, or Firm*—Oblon, Spivak, McClelland, Maier & Neustadt

[57] ABSTRACT

A cassette carrier unit for carrying a cassette, in which a plurality of substrates are housed, into and out of cassette chambers of the multi-chamber system including a hand on which the cassette is mounted. A multi-joined arm for supports the swingable hand, and a base supports the multi-joined swingable arm. The multi-joined arm includes a first shaft member rotatably attached to the hand, a second shaft member rotatably attached to the base, a third shaft member rotated associating with the first shaft member but in a direction reverse to the direction in which the first shaft member is rotated, and a fourth shaft member rotatably attached to the base and to which rotation drive force is transmitted. A first arm is rotatably attached to the first shaft member at the front end thereof and to the second shaft member at the base end thereof. A second arm is arranged substantially parallel to the first arm and fixed to the third shaft member at the front end thereof and to the fourth shaft member at the base end thereof. When the first and second arms are swung, the hand is swung in a direction reverse to the direction in which the first and second arms are swung.

10 Claims, 12 Drawing Sheets

MULTI-CHAMBER SYSTEM PROVIDED WITH CARRIER UNITS

BACKGROUND OF THE INVENTION

1. Field of the Invention

The present invention relates to a multi-chamber system provided with substrate carrier units and, more particularly, it relates to a cassette carrier unit and a substrate carrier unit for positioning a semiconductor wafer or an LCD substrate, for example, and carrying it in the multi-chamber system.

2. Description of the Related Art

As the semiconductor devices are more and more highly integrated, the multi-chamber system has been developed to meet any improvement and change of the process applied to them and continuously process them to shorten their manufacturing course.

when the wafers are re-carried into and out of each of cassette chambers in the multi-chamber system while housing them in a cassette, the cassette is carried from the clean room into the cassette chamber by a cassette carrier unit which is arranged in the cassette chamber. This cassette carrier unit includes a hand, a link arm and an arm drive mechanism.

The conventional cassette carrier unit, however, needs a large space to swing its link arm. The cassette chamber, therefore, must be made large in size to house the cassette carrier unit therein. In addition, an accelerating or decelerating force is added to the cassette carried in and out. This sometimes forces the wafers to come out of the cassette. Damage is thus caused to the wafers.

The multi-chamber system includes an alignment unit for centering the wafer relative to the wafer carrying passageway and directing the orientation flat (which will be hereinafter referred to "ori-fla") of the wafer to a desired direction. The wafer is taken out of the cassette chamber and mounted on a rotary stage of the alignment unit. The alignment of the wafer is conducted on the rotary stage. The wafer is then carried from an alignment chamber to the vacuum process chambers in which it is continuously processed. It is then cooled in a cooling chamber and returned into the cassette.

The multi-chamber system is more advantageous, as compared with the single chamber system, because the wafer transfer and cassette chambers can be made common to the vacuum process chambers. In the case of the multi-chamber system, however, the cassette, alignment and plural vacuum process chambers must be arranged enclosing the wafer transfer chamber. The whole of the multi-chamber system, therefore, becomes large in size. This means that the multi-chamber system occupies a large space in the clean room. It is therefore desired that the multi-chamber system is made smaller in size.

SUMMARY OF THE INVENTION

An object of the present invention is therefore to provide a cassette carrier unit capable of making each of the cassette chambers smaller in size and preventing the substrates from coming out of the cassette when the cassette is carried into and out of the cassette chambers.

Another object of the present invention is to provide a smaller-sized multi-chamber system in which the substrate can be carried without interfering with any other members.

According to an aspect of the present invention, there can be provided a cassette carrier unit for carrying a cassette, in which a plurality of substrates are housed, into and out of cassette chambers of the multi-chamber system comprising a hand on which the cassette is mounted, a multi-joined arm for supporting the hand swingable, and a base for supporting the multi-joined arm swingable, said multi-joined arm including a first shaft member rotatably attached to the hand, a second shaft member rotatably attached to the base, a third shaft member rotated associating with the first shaft member but in a direction reverse to the direction in which the first shaft member is rotated, a fourth shaft member rotatably attached to the base and to which rotation drive force is transmitted, a first arm rotatably attached to the first shaft member at the front end thereof and to the second shaft member at the base end thereof, and a second arm arranged substantially parallel to the first arm and fixed to the third shaft member at the front end thereof and to the fourth shaft member at the base end thereof, thereby when the first and second arms are swung one direction, the hand is swung in other direction reverse to said one direction in which the first and second arms are swung.

According to another aspect of the present invention, there can be provided a multi-chamber system comprising cassette chambers into and out of each of which a cassette in which a plurality of substrates are housed is carried, first substrate carrier means for taking a substrate out of the cassette and returning it into the cassette, alignment means for aligning the substrate to meet a process which will be applied to the substrate, a first substrate transfer chamber provided with the alignment means and the first substrate carrier means; load lock chambers, the substrate being carried between each of the load lock chambers and the first substrate transfer chamber by the first substrate carrier means; a second substrate carrier means for carrying the substrate into and out of the load lock chamber; a second substrate transfer chamber provided with the second substrate carrier means; vacuum process chamber, said substrate being carried between each of the vacuum process chambers and the second substrate transfer chamber by the second substrate carrier means and processed under decompressed atmosphere in each of them, and means for moving the alignment means in these regions including first and second levels, said first level being in region where the first substrate carrier means is moved together with the substrate and said second level being outside this region.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

The multi-chamber system provided with carrier units according to the present invention will be described with reference to the accompanying drawings.

Figure 1:
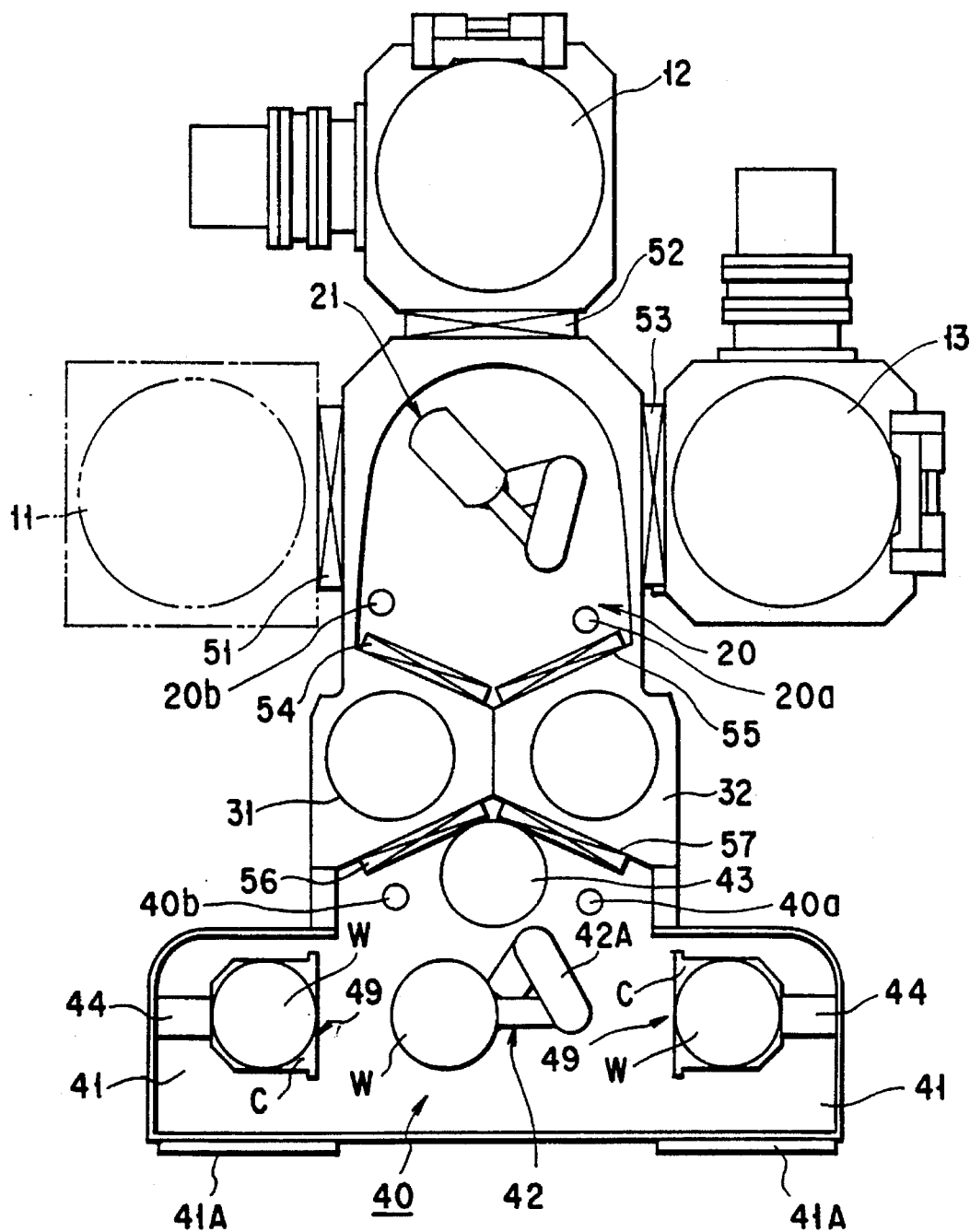
FIG. 1 is a perspective plan view showing a multi-chamber system.

As shown in FIG. 1, the multi-chamber system has first, second and third vacuum process chambers 11, 12 and 13, a transfer chamber 20, first and second auxiliary vacuum process chambers (or load lock chambers) 31 and 32, and a loader chamber 40. The multi-chamber system of this kind is disclosed in U.S. patent Ser. No. 08/136,753 (filed Dec. 16, 1993).

Etching process is applied to a wafer W to remove thin film from it in the first vacuum process chamber 11. Sputtering process is applied to it to form thin film on it in the second vacuum process chamber 12. Sputtering process is applied to it to form another thin film on it in the third vacuum process chamber 13.

The transfer chamber 20 has the vacuum process chambers 11, 12 and 13 along its three sides and it is communicated with them through gate valves 51, 52 and 53. A second transfer unit (or wafer carrier unit) 21 is arranged in it. Wafers w are carried one by one from it into each of the vacuum process chambers 11, 12 and 13 and carried out of each of them into it.

Exhaust and gas supply passages 20a and 20b are communicated with the transfer chamber 20 at their one ends. The exhaust passage 20a is also communicated with the pumping side of a vacuum pump (not shown) at its the other end and the transfer chamber 20 is decompressed to $10^{-7}$–$10^{-8}$ Torr through it. The transfer chamber 20 is thus kept vacuum while process units in the process chambers 11, 12 and 13 are under operation. The gas supply passage 20b is communicated with a nitrogen gas supply source (not shown) at its other end.

The load lock chambers 31 and 32 are substantially the same and they are located along a remaining front side of the transfer chamber 20. Their rear sides are connected to the front side of the transfer chamber 20 through gate valves 54 and 55 while their front sides to the loader chamber 40 through gate valves 56 and 57. Each of the load lock chambers 31 and 32 are adjusted from pressure of $10^{-3}$–$10^{-6}$ Torr to atmospheric pressure or nitrogen gas atmosphere.

Exhaust and gas supply passages 40a and 40b are communicated with the loader chamber 40 at their one ends. The exhaust passage 40a is also communicated with the suction side of a pressure control system (not shown) at its other end. The gas supply passage 40b is communicated with a nitrogen gas supply source (not shown) at its other end. The loader chamber 40 is adjusted to atmospheric pressure or nitrogen gas atmosphere.

The loader chamber 40 includes two cassette chambers 41, a first transfer unit (or wafer carrier unit) 42, an alignment unit 43 and pressure adjuster unit (not shown). A cassette C is housed in each of the cassette chambers 41 and 25 sheets of wafers W are housed in each of the cassettes C. The first wafer carrier unit 42 picks up the wafers W one by one out of the cassette C.

The alignment unit 43 is located in front of the gate valves 56 and 57. The wafer W is seated on a stage of the alignment unit 43 by the first wafer carrier unit 42. This stage is rotatably supported to position the wafer W in such a way that the orientation flat (which will be hereinafter referred to as "ori-fla") of the wafer W is directed in a desired direction.

The first wafer carrier unit 42 has a link arm 42A and a hand (not shown), and the wafer W is vacuum-sucked to the hand. The cassette C is arranged in the each cassette chamber 41 to face its opening 49 to the first wafer carrier unit 42. The first wafer carrier unit 42 extends its arm 42A into the cassette C and sucks the wafer W in the cassette C to its hand. The wafer W in the cassette C can be thus taken out of the cassette C by the first wafer carrier unit 42. A gate valve 41A is arranged along a front side of each cassette chamber 41. In short, the cassette chamber 41 is communicated with outside through the gate valve 41A and the cassette C can be carried from outside into the cassette chamber 41 through the gate valve 41A.

Cassette carrying and mounting mechanisms 44 and 45 will be described with reference to FIGS. 2 through 8.

Figure 2:
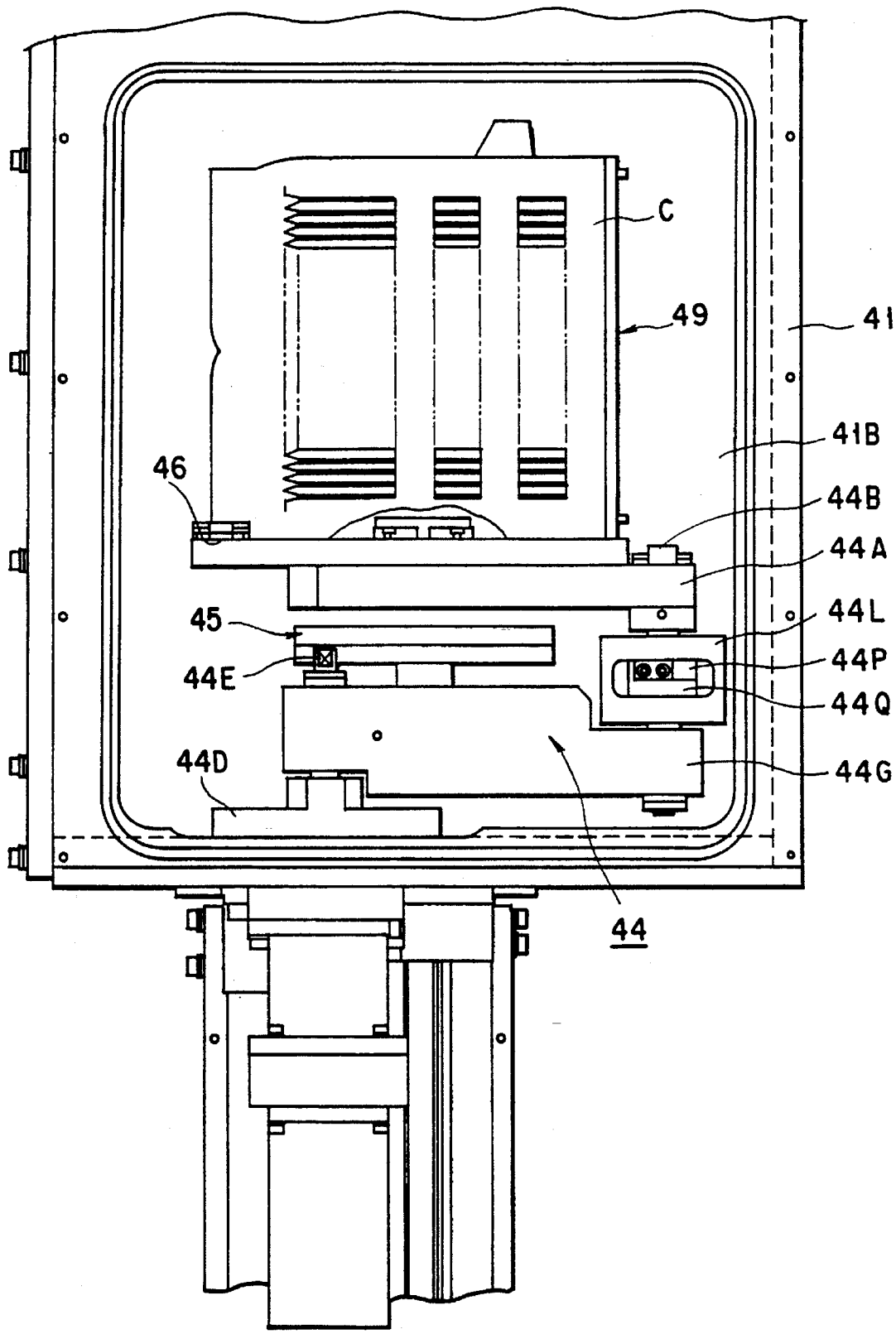
FIG. 2 is a front view showing a cassette chamber provided with the cassette carrier unit according to an embodiment or the present invention.
Figure 3:
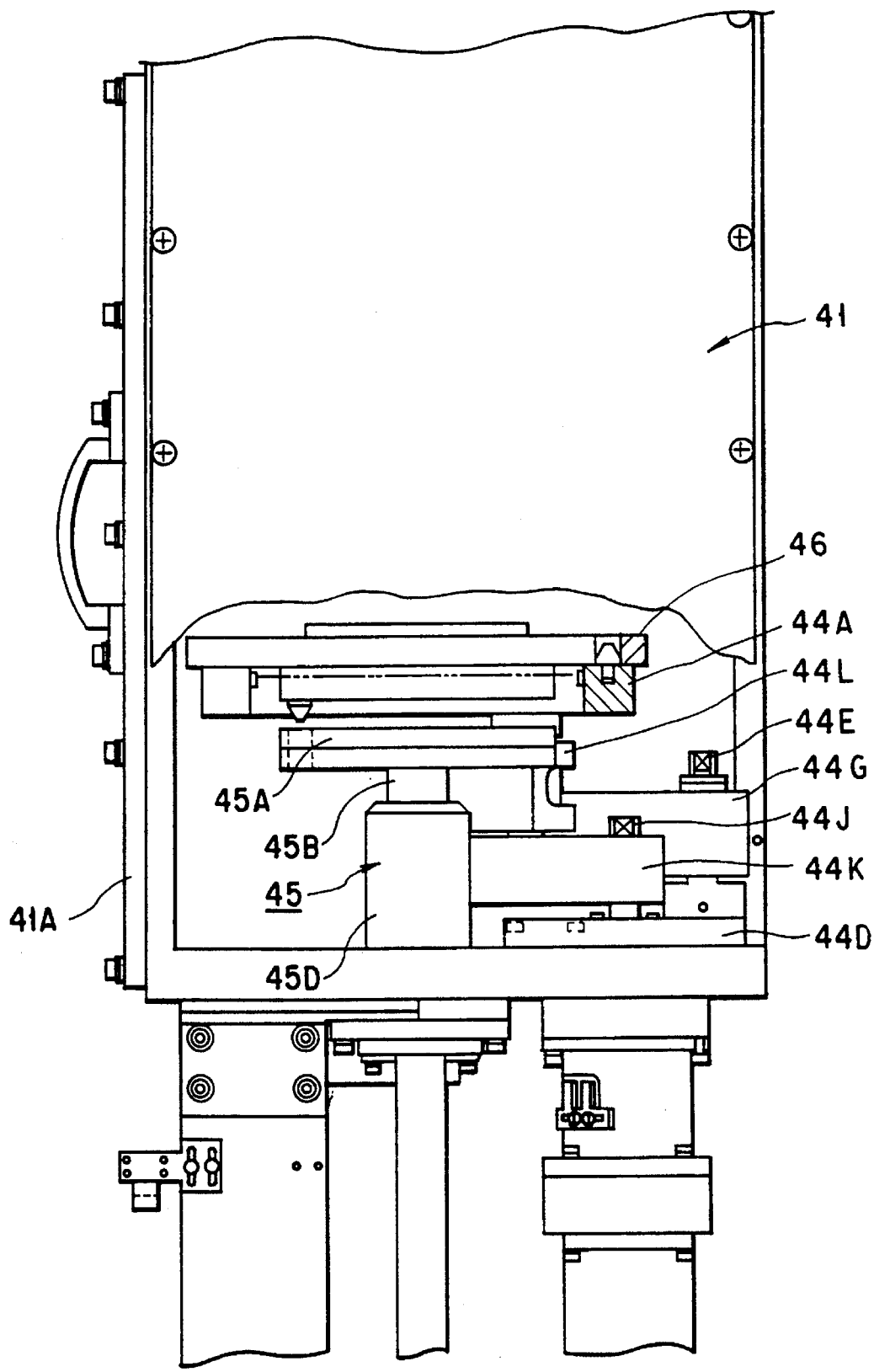
FIG. 3 is a partly-sectioned view showing the cassette chamber provided with the cassette carrier unit.

As shown in FIGS. 2 and 3, the cassette mounting mechanism 45 is arranged in the cassette chamber 41. The cassette C is carried to the front of the gate valve 41A and mounted on a stage of the cassette mounting mechanism 45 in the cassette chamber 41 through the gate valve 41A by a robot (not shown). The cassette mounting mechanism 45 is supported by a base 44D.

Figure 4:
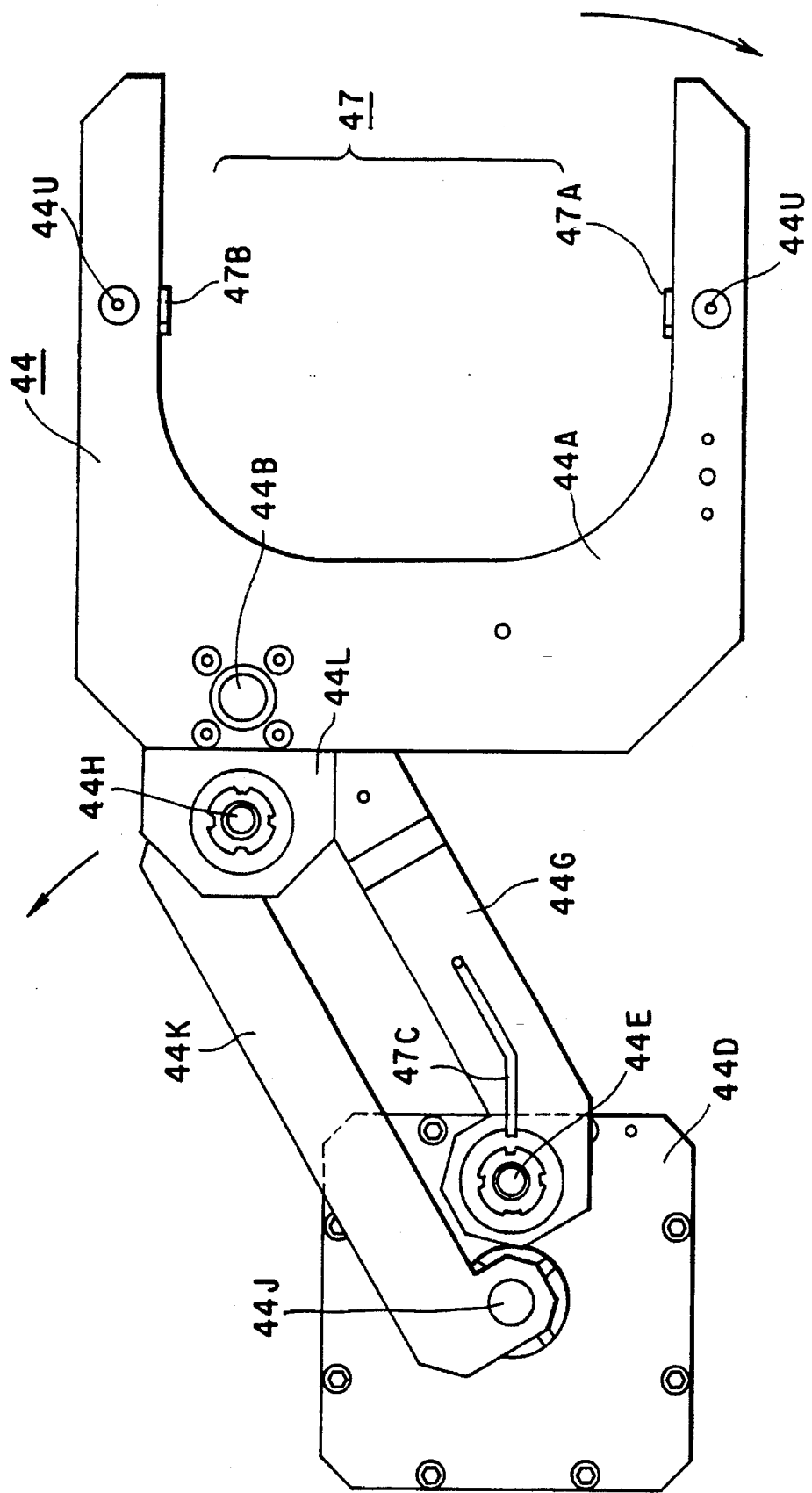
FIG. 4 is a plan view showing the cassette carrier unit.
Figure 5:
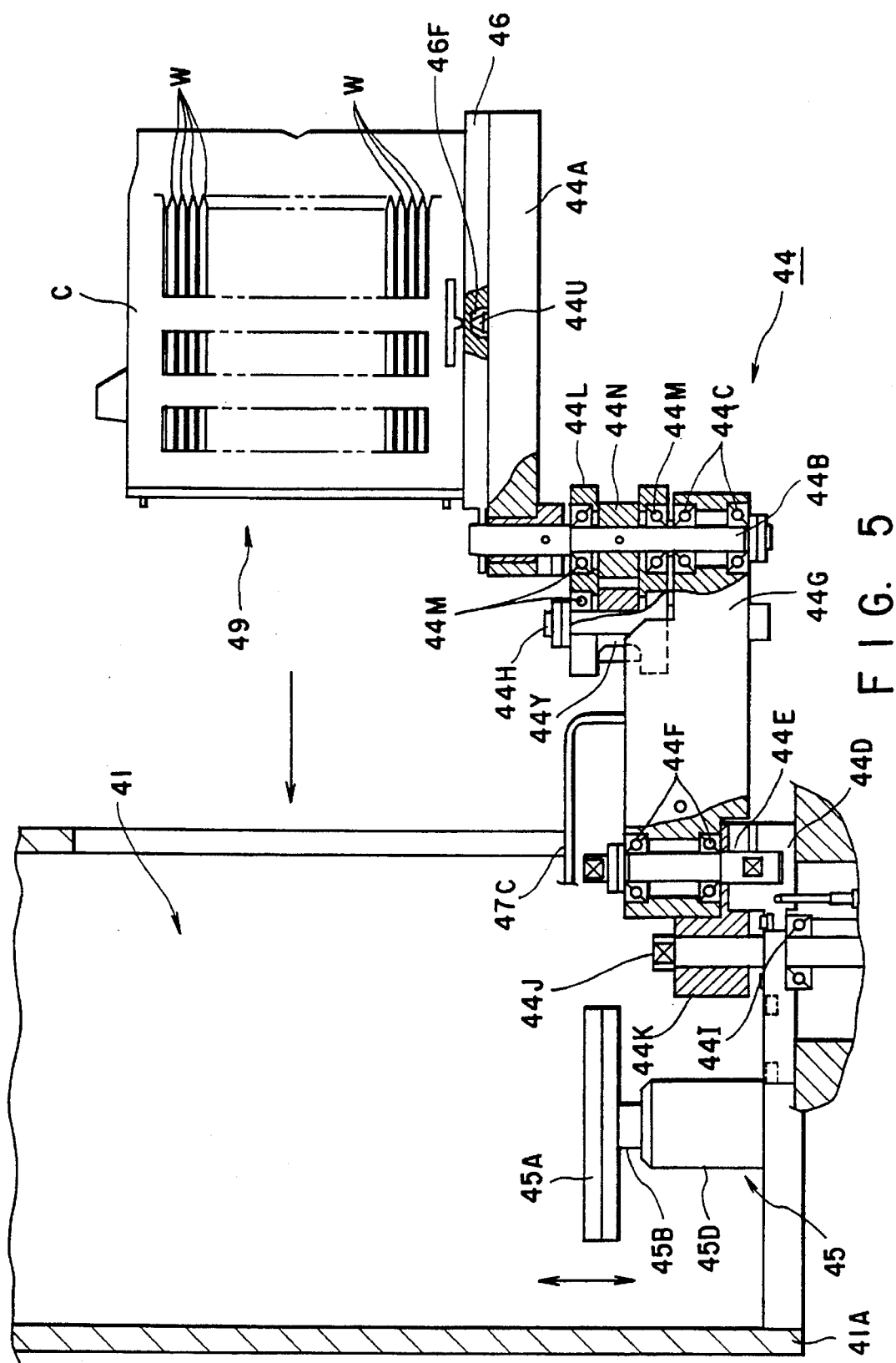
FIG. 5 is a partly-sectioned view showing the cassette carrier unit and a cassette.

As shown in FIGS. 4 and 5, the cassette mounting mechanism 45 has a hand 44A at the front end thereof. The hand 44A is at U-shaped aluminum alloy plate and it is rotatably supported by a first shaft member 44B. When viewed in the width direction of the hand 44A, the first shaft member 44B is positioned nearer to one side of the hand 44A but it may be positioned in the center thereof. This eccentric position of the first shaft member 44B is required only from the viewpoint of design.

A first arm 44G is rotatably attached, at its front end, to the first shaft member 44B through a pair of bearings 44C and, at its base end, to a second shaft member 44E through a pair of bearings 44F. The second shaft member 44E is supported by the base 44D.

A second arm 44K is fixed to a third shaft member 44H at its front end and rotatably attached, at its base end, to a rotatary drive shaft 44J through a bearing 44I. The second arm 44k is provided parallel to the first arm 44G.

As shown in FIGS. 4 through 8, the first and third shaft members 44B and 44H are rotatably attached to a box-like connecting member through a bearing 44M, passing through a joint box member 44L in the vertical direction. The shaft members 44B and 44H are provided in parallel with a certain interval interposed between them.

The rotary drive shaft 44J is connected to a drive source (not shown) at the lower end thereof and it rotates anticlockwise in FIG. 4. The third shaft member 44H rotates anticlockwise relative to the joint box member 44L, when both of arms 44G and 44K swing anticlockwise, to thereby transmits clockwise rotation to the first shaft member 44B through belts 44P and 44Q. At the same time, the third shaft member 44H transmits rotation (or clockwise rotation), reverse to those of the arms 44G and 44K, to the hand 44A, which is thus rotated clockwise round the first shaft member 44B.

Figure 6:
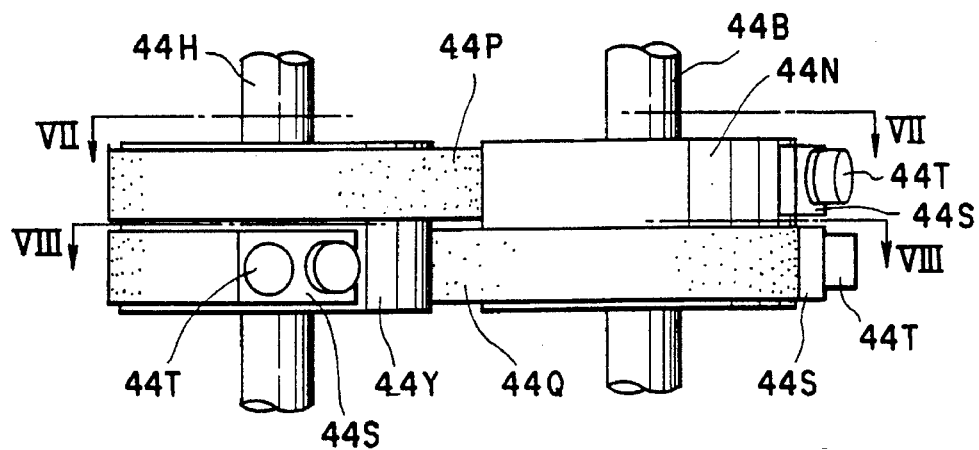
FIG. 6 is a view showing first and third shaft members, belts and connecting members of the cassette carrier unit partly enlarged.

As shown in FIG. 6, in the area of the joint box member 44L a first pulley 44N is attached to the first shaft member 44B, and a second pulley 44Y to the third shaft member 44H. The belts 44P and 44Q are attached to both of these pulleys 44N and 14Y in the cross belt manner to rotate the first and second shaft members 44B and 44H in reverse directions. The pulleys 44N and 44Y are made the same in outer diameter and they are rotated in reverse directions only by a same angle. The shaft members 44B, 44H, 44E, 44J, the pulleys 44N, 44Y and the belts 44P, 44Q are made of stainless steel. The pulleys 44N and 44Y, however, may be made of aluminum or its alloy.

Figure 7:
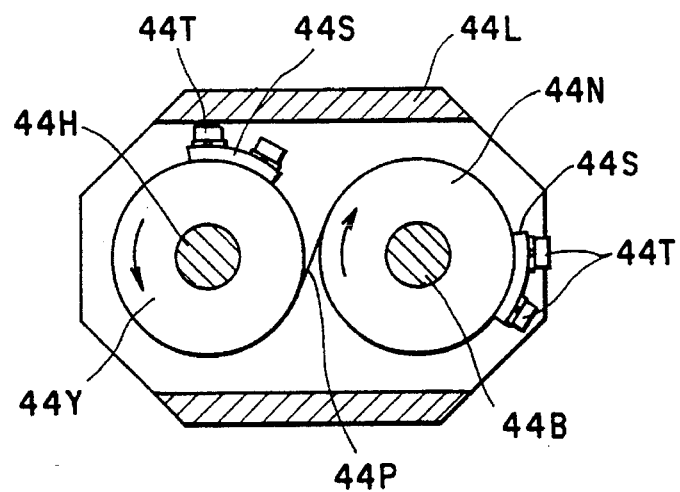
FIG. 7 is a sectional view taken along a line VII—VII in FIG. 6.
Figure 8:
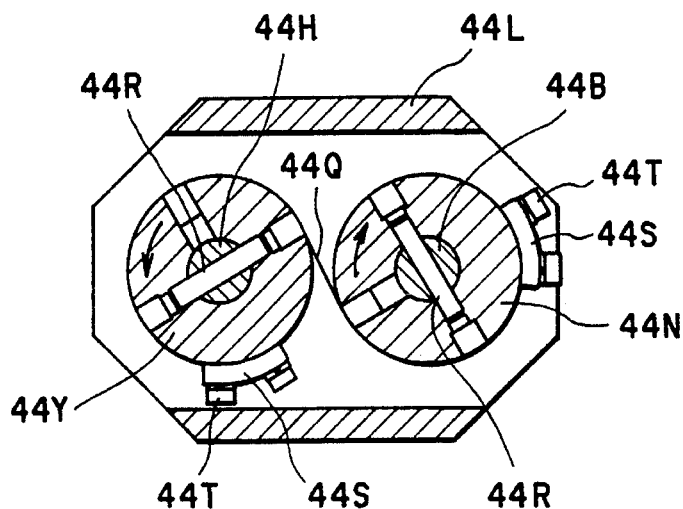
FIG. 8 is a sectional view taken along a line VIII—VIII in FIG. 6.

As shown in FIGS. 7 and 8, the first and second pulleys 44N and 44Y are fixed to the first and third shaft members 44B and 44H by pins 44R.

As shown in FIG. 6, the first belt 44P is stretched between the upper half of the pulley 44N and upper half of the pulley 44Y in the cross belt manner, covering about ¾ of the circumferential length of these pulleys 44N and 44Y. Both ends of the belt 44P are fixed to the pulleys 44N and 44Y by plate washers 44S and bolts 44T.

The second belt 44Q is stretched between the lower half of the pulley 44N and lower half of the pulley 44Y in the cross belt manner, covering about ¾ of the circumferential length of the pulleys 44N and 44Y. However, the cross belting of the second belt 44Q is made reverse to that of the first belt 44P. Both ends of the second belt 44Q are fixed to the pulleys 44N and 44Y by plate washers 44S and bolts 44T.

The operation of the cassette carrying mechanism 44 will be described referring to FIGS. 12 and 13.

Figure 12:
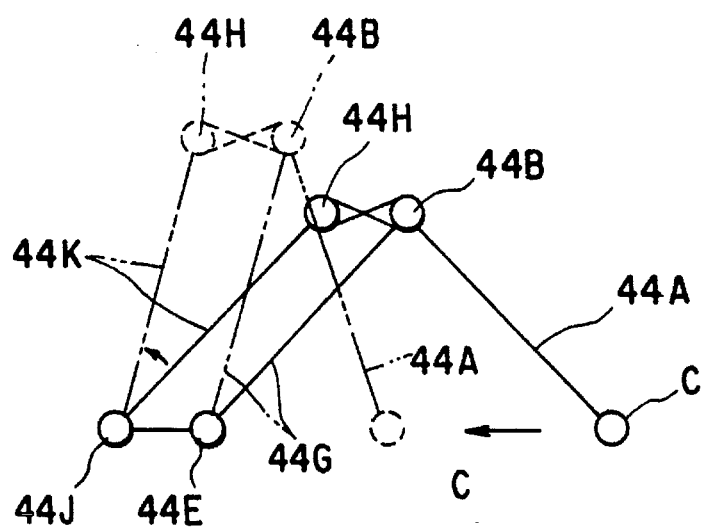
FIG. 12 is a skeleton plan showing the cassette carrier unit.
Figure 13:
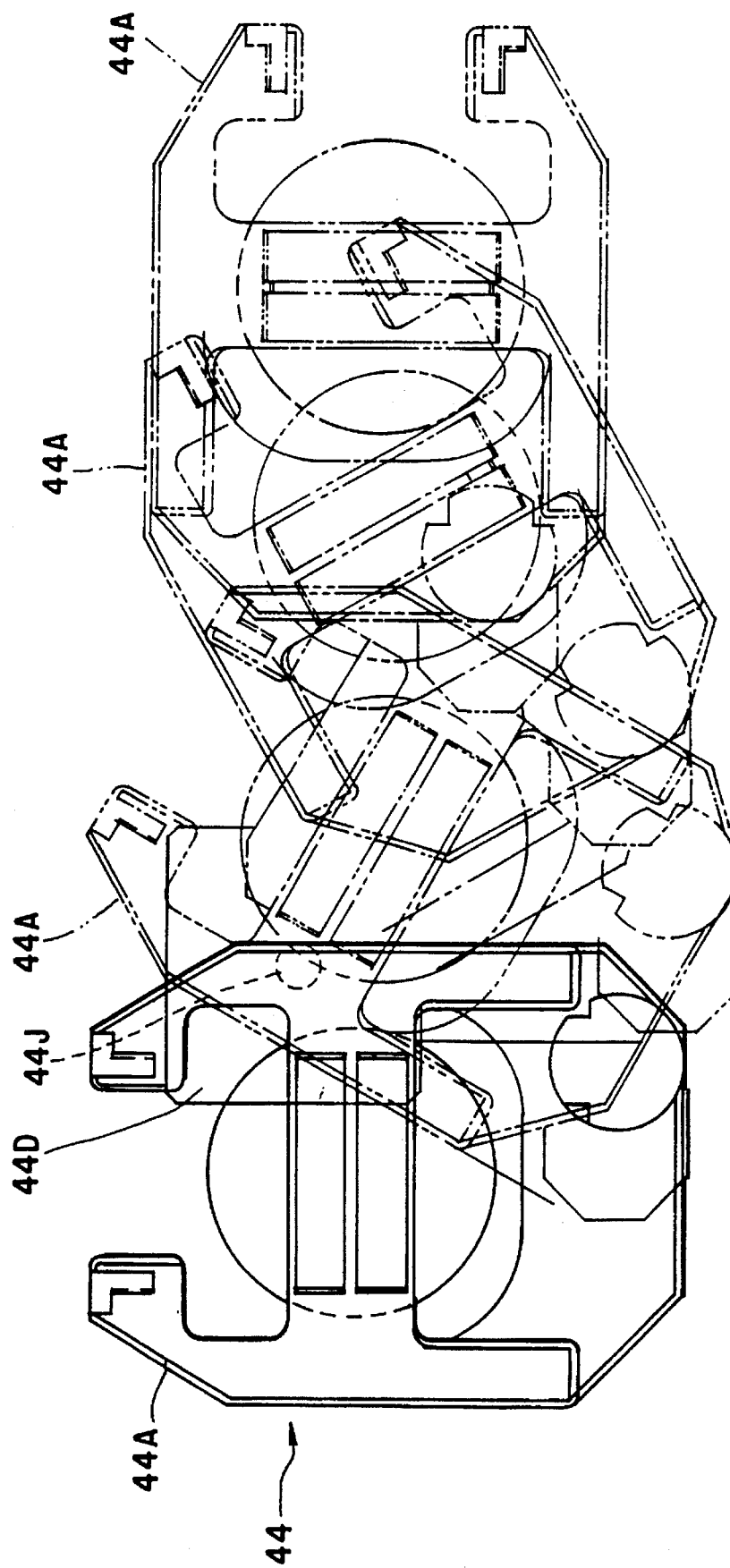
FIG. 13 is a plan view showing various postures of the hand which is under operation.

When the rotary drive shaft 44J is rotated anticlockwise in FIG. 12, the hand 44A changes its position, cooperating with the first arm 44G to form two equal sides of an isosceles triangle. The cassette C supported by the hand 44A moves substantially on a straight line.

when the rotary drive shaft 44J is rotated clockwise in FIG. 13, the hand 44A rotates clockwise, changing its posture between its home position and its cassette receiving position by turning 90°. This posture changing of the hand 44A is attained by the action of a belt mechanism which comprises the pulleys 44N, 44Y and the belts 44P, 44Q.

Figure 9:
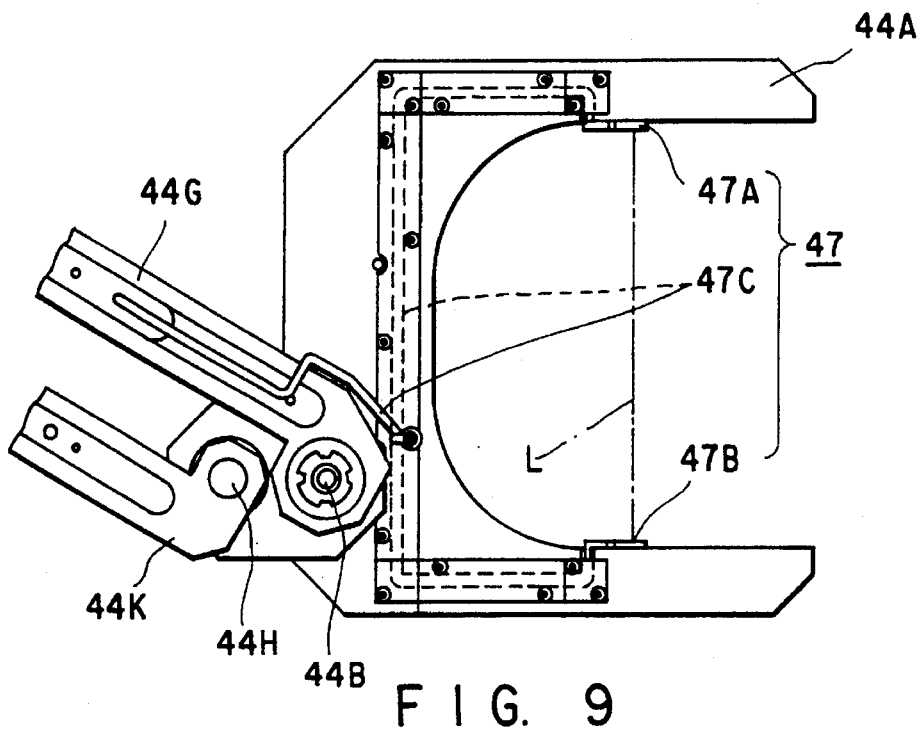
FIG. 9 is a plan view showing the underside of a hand of the cassette carrier unit partly enlarged.

As shown in FIG. 9, the hand 44A has a detector 47 for optically detecting the cassette C. The detector 47 comprises a light-emitting element 47A and a light-receiving element 47B. The light-emitting and -receiving elements 47A and 47B are attached to both sides of the U-shaped hand 44A, opposing to each other on a same optical axis. When the cassette C is on the hand 44A, light L emitted from the light-emitting element 47A is received by the light-receiving element 47B. This is attained by the action of switching pieces which will be described later. A signal which represents that light L has received by the light-receiving element 47B is sent to a control unit 100 (FIG. 16), which will be described later, through a line 47C. Responsive to the signal thus applied, the control unit 100 drives the cassette carrying mechanism, 44.

Figure 10:
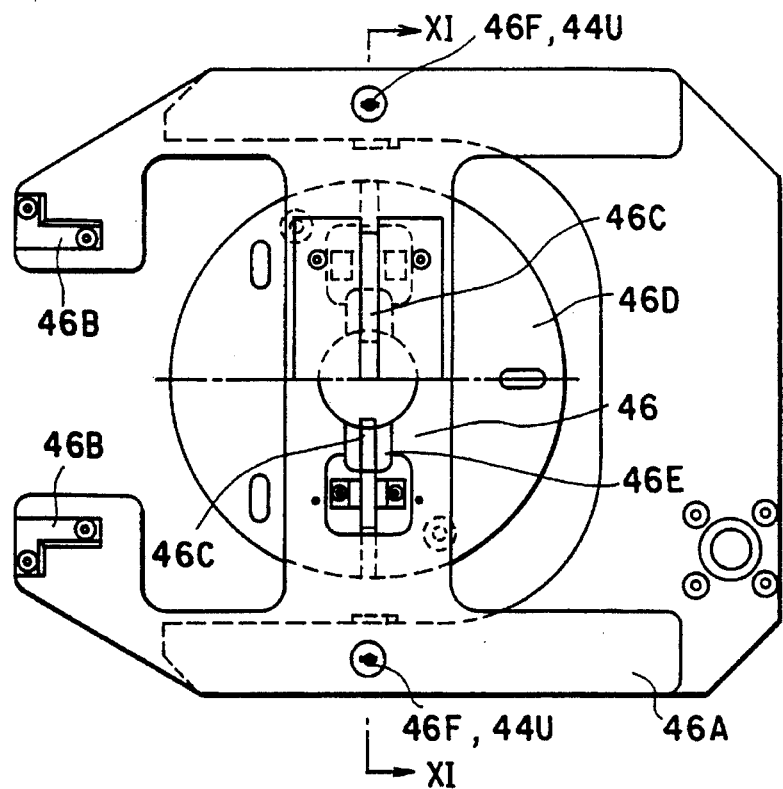
FIG. 10 is a plan view showing the cassette carrier unit provided with an alignment unit.
Figure 11:
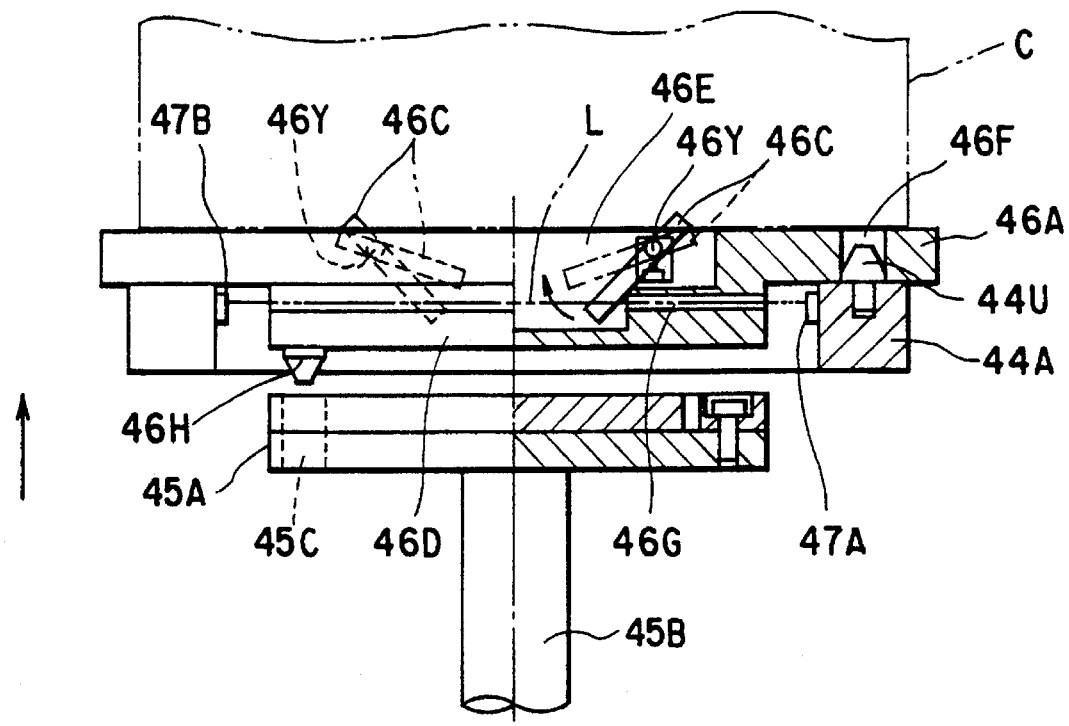
FIG. 11 is a partly-sectioned view showing the cassette carrier unit provided with the alignment unit.

As shown in FIGS. 10 and 11, the hand 44A has a positioner jig 46 for positioning the cassette C in a predetermined direction. The positioner jig 46 includes a body 46A, a pair of engaging parts 46B and a pair of switch pieces 46C. The body 46A is formed like an H-shape, comprising cassette supports parallel to each other and a bridge between them. The engaging parts 46B are attached to front ends of the cassette supports of the body 46A and engaged with two corners of the cassette C. The switching pieces 46C are freely swingable attached to the center portion of the bridge of the body 46A with a certain interval interposed between them.

An engaging disk 46D is made integral to the underside of the bridge of the body 46A and it is engaged with the stage 45A of the cassette mounting mechanism 45. It is same in diameter as the stage 45A. A recess 46E in which the switching pieces 46C are arranged is formed in the bridge of the body 46A. Each switching piece 46C is supported by a horizontal rod 46Y, tilting its inner end downward and projecting its outer end from the top of the body 46A. Beam light L is usually intercepted by the switching pieces 46C.

When the cassette C is mounted on the body 46A, as shown in FIG. 11, the switching pieces 46C are swung in the vertical direction to allow beam light L to be received by the light-receiving element 47B. In short, the switching pieces 46C intercept beam light L when no cassette C is on the positioner jig 46 and they allow beam light L to pass to the light-receiving element 47B when the cassette C is on the positioner jig 46.

A pair of holes 46F are formed substantially in the center of each cassette support of the body 46A in the longitudinal direction, as shown in FIG. 10. A pair of protrusions 44U are projected from the top of the hand 44A to fit into its corresponding hole 46F of each cassette support. Therefore, the positioner jig 46 is freely detachably attached to the hand 44A, while fitting each of the protrusions 44U of the hand 44A into each of the holes 46F. Formed in the bridge of the positioner jig 46 attached to the hand 44A is a through-hole 46G through which beam light L can pass in the longitudinal direction of the bridge.

As shown in FIGS. 2 through 5 and 11, the cassette mounting mechanism 45 is arranged substantially in the center of each cassette chamber 41 to receive the cassette C from the hand 44A of the cassette carrying mechanism. The cassette mounting mechanism 45 has the stage 45A on which the cassette C is mounted. The stage 45A is kept waiting at such a level at which the stage 45A does not interfere with the hand 44A and which is lower than the position of the cassette C carried in, when the cassette C is to be carried into the cassette chamber 41. It is so sized as to pass through an opening which is formed by the U-shaped portion of the hand 44A. It is connected to a rod 45B of a driving mechanism 45D and moved up and down by the air cylinder 45D. The driving mechanism 45D preferably an air cylinder mechanism of a ball screw mechanism. Rising and lowering stroke of the stage 45A is several times the height of the cassette C.

A pair of through-holes 45C are formed in the stage 45A. On the other hand, a pair of projections 46H are formed on the underside of the engaging disk 46D to correspond to the through holes 45C of the stage 45A. When the stage 45A is moved up, the projections 46H of the engaging disk 46D are fitted into the through-holes 45C of the stage 45A while the protrusions 44U of the hand 44A come out of the holes 46F of the positioner jig 46. The cassette C can be thus lifted together with the positioner jig 46 from the hand 44A. When the positioner jig 46 is released from the hand 44A, the hand 44A is carried out of the cassette chamber 41 and the stage 45A is further moved upward.

A wafer detector (not shown) is arranged in the cassette chamber 41 to detect the position of each wafer W in the cassette C. Responsive to a signal applied from the wafer detector, the control unit 100 controls the cassette mounting mechanism 45 to align the height of a wafer, which is to be picked up from the cassette C, with that of the first wafer carrier mechanism 42.

The above-described system uses a vacuum pump (not shown), a wafer pump (not shown) for supplying coolant and many electric instruments (not shown). Thermal switches are attached to motors for the pumps and the electric instruments. Abnormal high temperatures of these motors and electric instruments which are caused by overload are detected by the thermal switches and responsive to detection signal thus applied, current supply to the motors and electric instruments is stopped to prevent them from being damaged.

It will be described how the cassette C is carried in and out in the case of the above-described multi-chamber system.

The self-running robot (not shown) carries the cassette C from the other system line to the front of the front door 41A of the cassette chamber 41 and mount it on the hand 44A, directing its wafer carrying-in and -out opening opening 49 to the front. The engaging parts 46B of the positioner jig 46 are engaged with its two corners at this time and it is thus positioned. When its positioning is not correct or it is not mounted on the positioner jig 46, light L emitted from the detector 47 is intercepted by the switching pieces 46C. The cassette carrying mechanism 44 is thus left inoperative. When it is correctly positioned by the positioner jig 46, the switching pieces 46C are swung to make the cassette carrying mechanism 44 operative.

When the cassette carrying mechanism 44 is made operative, the rotary drive shaft 44J is rotated anti-clockwise and the second arm 44K is swung in the same direction, the third shaft member 44H and the joint box member 44L follow the second arm 44K. The first arm 44G is swung anticlockwise round the second shaft member 44E together with the second arm 44K at this time. The cassette C is thus carried into the cassette chamber 41.

As shown in FIGS. 7 and 8, the third shaft member 44H is rotated anticlockwise while the first shaft member 44B is rotated clockwise. The hand 44A is thus rotated clockwise. When the first and second arms 44G and 44K are swung, substantially prepedicular to one side of the cassette chamber 41, by 90°, the hand 44A is carried into the cassette chamber 41. The hand 44A is also gradually swung clockwise by 90° for this while and overlapped the first arm 44G and second arm 44K. The open side 49 of the cassette C in the cassette chamber 41 is thus opposed to the first carrier mechanism 42.

When the cassette C is carried into the cassette chamber 41, the stage 45A is moved upward to lift the cassette C together with the positioner jig 46 from the hand 44A. When the cassette C is mounted on the stage 45A, the stage 45A is further lifted to align the height of a wafer W with that of the first carrier mechanism 42. The wafer W is thus taken out of the cassette C by the first carrier mechanism 42. The wafer W is then carried into the first process chamber 11 through either of the auxiliary vacuum process chambers 31 and 32 by the second carrier mechanism 21. An etching process is applied to the wafer W in the first process chamber 11 and sputtering process is then applied to it in the second and third process chambers 12 and 13. It is taken out of the third process chamber 13 and then reversely carried from the third process chamber 13 into the cassette chamber 41 where it is housed in the cassette C. A next wafer W in the cassette is aligned in level with the first carrier mechanism 42 by the mechanism 45 and again carried into the process chambers 11, 12 and 13, as described above.

When all of the wafers W in the cassette C are processed, the stage 45A is moved down to make the positioner jig 46 engage with the hand 44A. The cassette C is carried out of the cassette chamber 41 together with the hand 44A and then transferred from the hand 44A to the self-running robot.

According to the above-described embodiment, the hand 44A is swung when the cassette C is carried into the cassette chamber 41. Therefore, the cassette C changes its posture according to swing the hand 44A. Force in the carrying-in direction of the cassette C is thus added to the cassette C together with force in the circumferential direction thereof. This prevents the wafers W from coming out of the cassette C through the open 49. All of the wafers W in the cassette C can be thus more reliably carried into the cassette chamber 41 without coming out of the cassette C.

Further, the belts 44P and 44Q are made of stainless steel. Therefore, the amount of dusts and particles can be reduced to a greater extent, as compared with the case where resin-made belts are used.

According to the above-described cassette carrying mechanism of the present invention, the direction in which the hand 44A is swung is made reverse to that direction in which the first and second arms 44G and 44K are swung. Therefore, acceleration force with which the wafers W in the cassette C are accelerated to the open 49 of the cassette C can be reduced remarkably to thereby prevent the wafers W from coming outside out of the cassette C through the opening 49 thereof.

Further, when the cassette C is carried into the cassette chamber 41, the hand 44A is overlapped with the first and second arms 44G and 44K in the cassette chamber 41. This enables space in the cassette chamber 41 to be saved.

Furthermore, the positioner jig 46 is arranged on the hand 44A. Therefore, the cassette C can be mounted on the hand 44A while keeping the opening 49 of the cassette C correctly positioned.

Still further, the hand 44A is provided with the detector 47 for detecting the cassette C. The cassette C which has been positioned on the hand 44A can be thus confirmed by the detector 47.

Still further, the cassette mounting mechanism 45 makes it possible to align the height of a wafer W, which is to be taken out of the cassette C, with that of the hand 44A. The wafer can be thus more reliably taken out of the cassette C by the first carrier unit 42.

Although the present invention has been applied to the vacuum process apparatus in the above-described case, it can be applied to those apparatuses in which substrates are processed under normal pressure.

Although the optical sensor has been used to detect the cassette C in the above-described case, electromagnetic means may be used instead.

Although the hand 44A has been swung by the paired belts 44P and 44Q in the above case, cams and gears may be used instead.

The present invention will be further described with reference to FIGS. 14, 15, 16 and 17A–17C.

Figure 14:
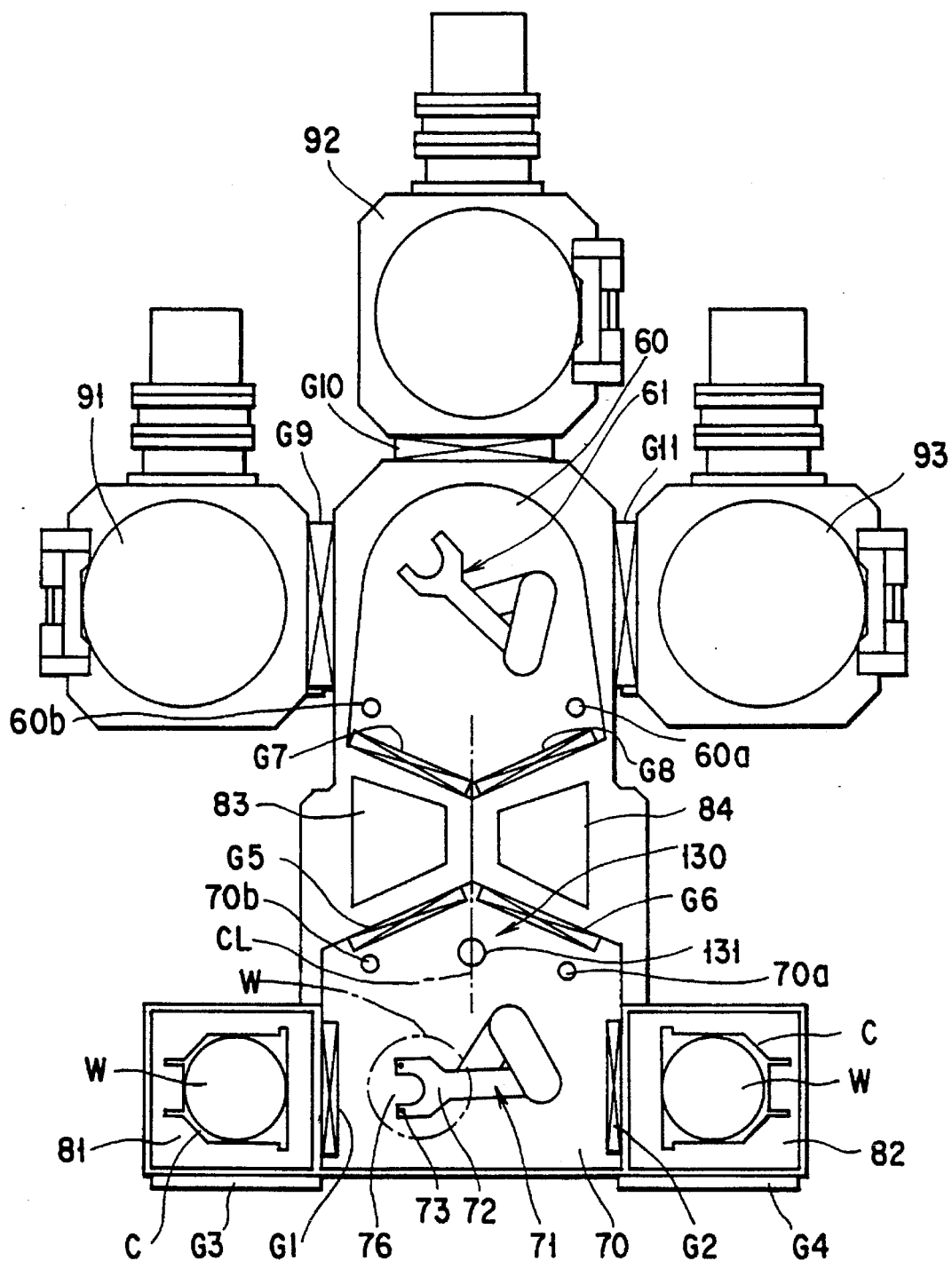
FIG. 14 is a plan view showing another multi-chamber system.
Figure 15:
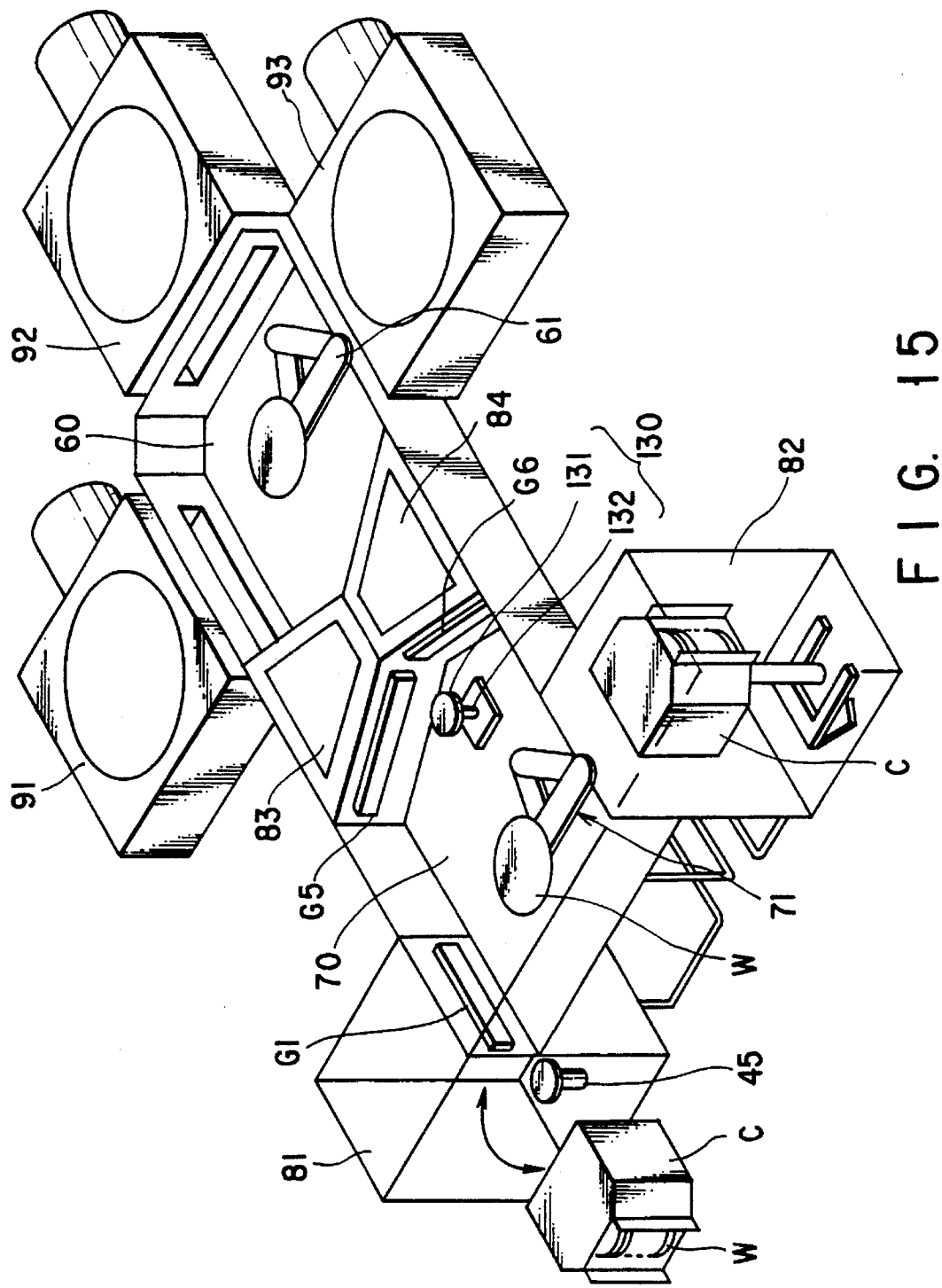
FIG. 15 is a perspective view showing the multi-chamber system.

A multi-chamber system shown in FIGS. 14 and 15 includes first, second and third vacuum process chambers 91, 92 and 93, a second transfer chamber 60, first and second load lock chambers 83 and 84, and a first transfer chamber (or loader chamber) 70.

Different processes are applied to a wafer W in each of the first, second and third vacuum process chambers 91, 92 and 93. More specifically, an etching process is applied to the wafer W in the first vacuum process chamber 91 to remove unnecessary thin film from it. In the second vacuum process chamber 92, a sputtering process is applied to the wafer w, which has been etching-processed in the first vacuum chamber 91, to form a thin film on it. In the third vacuum process chamber 93, another sputtering process is applied to the wafer W, which has been sputtering-processed in the second vacuum chamber 92, to form another thin film on the already-formed thin film of it.

The second transfer chamber 60 has the first, second and third vacuum process chambers 91, 92 and 93 along its three sides and it is communicated with them through gate valves G9, G10 and G11. A second transfer unit (or wafer carrier unit) 61 is housed in the second transfer chamber 60. The wafers W are carried one by one from the transfer chamber 60 into each of the vacuum process chambers 91, 92 and 93 and from each of them into the transfer chamber 60 by the second wafer carrier unit 61.

Exhaust and gas supply passages 60a and 60b are communicated with the second transfer chamber 60 at one of the ends thereof. The exhaust passage 60a is also communicated with the pumping side of a vacuum pump (not shown) at the other end thereof and the second transfer chamber 60 can be thus decompressed to $10^{-7}$–$10^{-8}$ Torr. The second transfer chamber 60 is kept under a vacuum at all times when process units are under operation in the vacuum process chambers 91, 92 and 93. The gas supply passage 60b is communicated with a nitrogen gas supply source (not shown) at the other end thereof.

The load lock chambers 83 and 84 are substantially the same in structure and their rear sides are connected to the front side of the second transfer chamber 60 through gate valves G7 and G8. Their front sides are communicated with the first transfer chamber 70 through gate valves G5 and G6. Each of chambers 83 and 84 is adjusted from $10^{-3}$–$10^{-6}$ Torr to the atmosphere of nitrogen gas which is equal to atmospheric pressure.

Exhaust and gas supply passages 70a and 70b are communicated with the first transfer chamber 70 at one of the ends thereof. The exhaust passage 70 is communicated with the suction side of a pressure controller (not shown) at the other end thereof. The gas supply passage 70b is communicated with a nitrogen gas supply source (not shown) at the other end thereof. The first transfer chamber 70 is adjusted to the atmosphere of nitrogen gas which is equal to atmospheric pressure.

The first transfer chamber 70 includes two cassette chambers 81, 82, a first transfer unit (or wafer carrier unit) 71, an alignment unit 130, and a pressure adjuster unit (not shown). A cassette C in which 25 sheets of wafers W are housed is housed in each of the cassette chambers 81 and 82. The wafers W in the cassette C are taken one by one out of the cassette C.

The alignment unit 130 is located in front of the gate valves G5 and G6, separating them by an equal distance. The wafer W is mounted on a rotary stage 131 of the alignment unit 130 by the first wafer carrier unit 71. That open side of each of first and second auxiliary vacuum chambers 83 and 84 which is on the side of the first transfer chamber 70 is directed to a center line CL in FIG. 14. The rotary stage 131 is on the center line CL. It is rotatably supported by a shaft 132 to position the wafer W in such a way that the ori-fla of the wafer w can be directed to a desired direction.

The first carrier unit 71 is intended to carry the wafer W to the first and second cassette chambers 81, 82, the rotary stage 131 and the auxiliary vacuum chambers 83, 84 and pick up it from them. The first carrier unit 71 has a multi-joined arm 72 which is forked at the front thereof. The forked front ends of the arm 72 are provided with a pair of suction holes 73 to vacuum-suck the wafer W to the arm 72. These suction holes 73 are connected to a vaccum pump (not shown) through their passages (not shown). The forked front portions of the arm 72 form a space 76 through which the shaft 132 of the rotary stage 131 can be passed.

The alignment unit 130 will be described with reference to FIGS. 16 and 17A–17C.

In the conventional system, a wafer alignment unit (not shown) is arranged in a different chamber (not shown) and the wafer w is carried in and out between this different chamber and the loader chamber (not shown). In the system of the present invention, however, the alignment unit 130 is arranged in the loader chamber 70. The wafer W which is being positioned, therefore, sometimes interferes with the other wafer W which is being carried. In short, a region 79 where the wafer W is positioned partly overlaps another region 78 where the wafer W is carried. As will be described later, however, the rotary stage 131 is lifted upward to avoid the region 78 when the wafer W is carried in the loader chamber 70. This prevents the wafer W from colliding against the other and the member 71 from interfering with the member 131.

Figure 16:
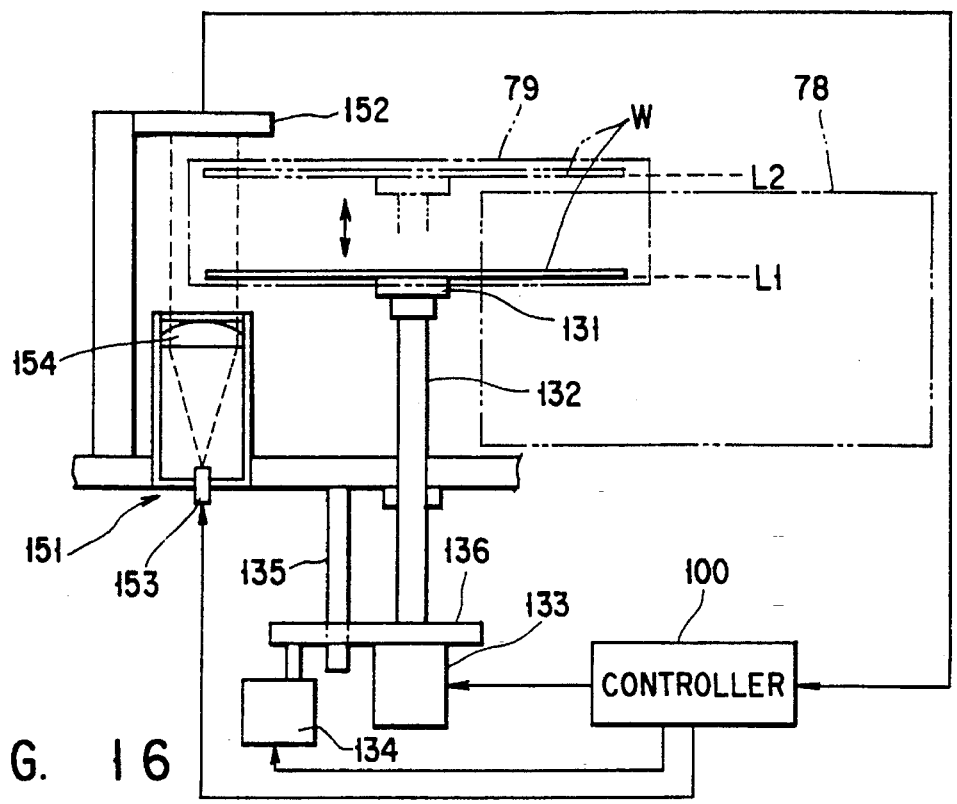
FIG. 16 is a block diagram showing a wafer positioner unit.

As shown in FIG. 16, the wafer alignment unit 130 includes a light emitting section 151, a light receiving section 152 and a control section 100. The light emitting section 151 is positioned under the rim portion of the wafer W which is mounted on the rotary stage 131. The light receiving section 152 is located above the light emitting section 151 and opposed to it with the rim portion of the wafer w interposed between them. The control section 100 is connected to the light emitting and receiving sections 151 and 152 at the input side thereof and to a motor 133 and a lifter unit 134 at the output side thereof. The light emitting section 151 has a laser shooter 153 and a lens 154. A laser beam is shot from the laser shooter 153 and made into parallel rays through a slit (not shown). The light receiving section 152 comprises a pin photo-diode for outputting electric signal which changes depending upon the area of light received. The center and the ori-fla of the wafer W can be thus detected by the wafer positioner unit 130 when the wafer W is turned around by the rotary stage 131.

The shaft 132 is connected to the motor 133 at the lower end thereof, passing through the floor of the loader chamber 70. The motor 133 is connected to the output side of the controller 100 and it is controlled by the controller 100. It is located under the first transfer unit 71 and also connected to a lifter frame 136, which is lifted along a guide shaft 135 by a lifter unit 134. The rotary stage 131 can be thus moved up and down together with the motor 133 by the lifter unit 134.

The stroke of the rotary stage 131 is set in such a way that the rotary stage 131 can move up and down between first and second levels $L_1$ and $L_2$ in FIG. 16.

The rotary stage 131 receives the wafer W from the first transfer unit 71 at the first level $L_1$ and the wafer W held on the first transfer unit 71 does not interfere with the other wafer W mounted on the rotary stage 131 at the second level $L_2$.

Each of the first and second auxiliary vacuum chambers 83 and 84 includes heating and cooling means (not shown) and upper and lower wafer stages (not shown). Their rear sides are connected to the second transfer chamber 60 through gate valves G7 and G8.

In the case of this embodiment, the wafer may be continuously processed in the vacuum process chambers 91–93. Or the wafers W may be differently processed in them. When the wafers W are differently processed in them, the control section 100 has data relating to how the wafers W are oriented or aligned in them.

When the wafer W is processed in each of the vacuum process chambers 91–93, a peripheral portion of the wafer is sometimes covered by a shield ring (not shown) so as not to leave there any residue of film formed. In order to make the flat portion of the shield ring accorded with its ori-fla, it is needed in this case to previously calculate and confirm the direction of it. When its direction is not same in each of the vacuum process chambers 91–93, therefore, data relating to its direction in each of them are previously stored in the control section 100. The control section 100 selects those from data stored which denote its direction in each of them, calls them and controls the alignment unit 130 responsive to them called.

Figure 17A:
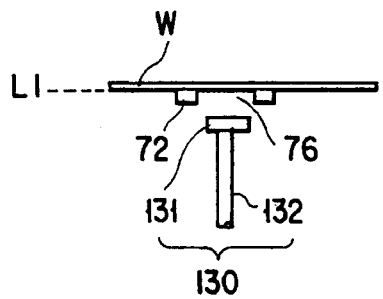
FIGS. 17A through 17C intended to explain how the wafer is positioned and carried.
Figure 17B:
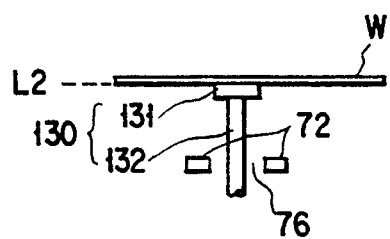
Figure 17C:
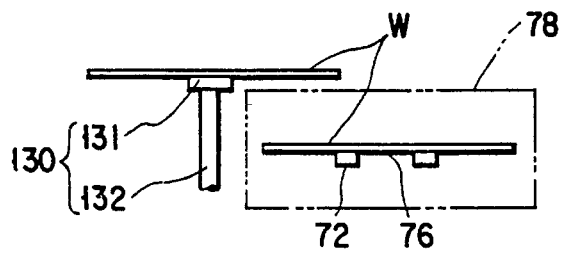

Referring to FIGS. 17A through 17C, it will be described how the units 71 and 130 are operated.

The region 79 where the wafer W is positioned on the rotary stage 131 partly overlaps the region 78 where the wafer is carried by the first carrier unit 71. However, the rotary stage 131 is moved up to avoid the region 78 when the wafer W is carried by the first carrier unit 71. This prevents the wafer W from colliding against the other and the members 71 and 131 from interfering with each other.

The cassette C is mounted on the stage 45A in the first cassette chamber 81 by the carrier unit 44 (see FIG. 5). Twenty five sheets of silicon wafers W are housed in the cassette C. The gate valve G3 is closed and the first cassette chamber 81 is adjusted to the atmosphere of nitrogen gas which is equal to atmospheric pressure. The stage 45A is lifted to the predetermined level.

The gate valve G1 is opened and the arm 72 of the first carrier unit 71 is inserted into the first cassette chamber 81 to take a sheet of the wafer W out of the cassette C. The first cassette chamber 81 has been adjusted to atmospheric pressure. Therefore, the wafer W can be readily sucked to the arm 72. When the stage 45A is lifted and the wafer W is taken up by the arm 72, the transferring of the wafer W between the cassette C and the first carrier unit 71 is finished.

As shown in FIG. 17A, the rotary stage 131 is kept waiting at a level lower than the first level $L_1$. The arm 72 of the first carrier unit 71 is positioned above the rotary stage 131 and the wafer W is released from the arm 72.

As shown in FIG. 17B, the rotary stage 131 is lifted to seat the wafer W on it while passing through the space 76 between the forked portions of the arm 72. The rotary stage 131 is further lifted to the second level $L_2$. Until then, a wafer w which has been processed is mounted on the lower stage (not shown) in the first load lock chamber 83. The first carrier unit 71 takes the already-processed wafer W out of the first auxiliary vacuum chamber 83 and transfers it into the cassette C in the cassette chamber 81.

As shown in FIG. 16, the region 78 where the wafer w is transferred from the first load lock chamber 83 into the cassette C is overlapped with the region 79 where another wafer W is positioned on the rotary stage 131. As shown in FIG. 17C, however, the rotary stage 131 is lifted to avoid from the wafer carrying region 78. This prevents the wafer W on the rotary stage 131 from colliding against the arm 72 of the first carried unit 71.

The center and ori-fla of the wafer W on the rotary stage 131 are detected. The ori-fla of the wafer W is thus directed to a predetermined direction. This direction in which the ori-fla of the wafer W is directed meets the process which will be applied to the wafer W. In short, data relating to the direction of the ori-fla called by the control section 100 and responsive to this data thus called, the motor 133 is controlled to direct the ori-fla of the wafer W to the predetermined direction.

The first carrier unit 71 is kept waiting under the rotary stage 131 and the rotary stage 131 is lowered. The wafer W on the rotary stage 131 is thus seated on the arm 72 of the first carrier unit 71. The center of the wafer W is positioned at this time on the basis of data relating to the center of the wafer w already detected.

The wafer W is then carried into the first auxiliary vacuum chamber 83 and transferred from the first carrier unit 71 to the upper stage in the first auxiliary vacuum chamber 83. The gate valve G5 is closed and the chamber 83 is decompressed to $10^{-3}$–$10^{-6}$ and pre-heated to 500° C. for 30–60 seconds. A next wafer W iS similarly carried into the second auxiliary chamber 84 and pre-heated there.

The gate valve G7 is opened and the auxiliary vacuum chamber 83 is thus communicated with the second transfer chamber 60. The second transfer chamber 60 has been decompressed to $10^{-7}$–$10^{-8}$ Torr. The already-processed wafer W is mounted on the lower stage in the auxiliary vacuum chamber 83 by the second carrier unit 61. The other wafer W is then picked up from the upper stage in the chamber 83 and carried into the first vacuum process chamber 91 by the second carrier unit 61. On the other hand, the already-processed wafer w is cooled in the first auxiliary vacuum chamber 83 and returned into the returned into the cassette C. The cassette C is carried outside from the cassette chamber 82 by the robot.

According to the above-described wafer carrying mechanism, the rotary stage 131 is lifted at the time when the wafer w is carried into and out of the auxiliary chamber 83 or 84 by the first carrier unit 71. This prevents the wafer w on the rotary stage 131 from colliding against the other wafer W on the arm 72. While positioning the wafer W on the rotary stage 131, therefore, the other wafer W can be taken out of the auxiliary vacuum chamber 83 or 84 by the first carrier unit 71. A higher throughput can be thus realized. In addition, the first carrier unit 71 may be moved not up and down but on a horizontal plane. It can be therefore made simpler in structure.

Further, data relating to how the wafer is aligned in each of the vacuum process chambers 91–93 are previously prepared, selected to meet the process which will be applied to the wafer W in each of the chambers 91–93, and the alignment of the wafer W in each of them is made on the basis of the data thus selected. Therefore, the attaching of the shield ring to the wafer W and the aligning the wafer in each of process chambers 91–93 can be made freer.

Furthermore, data relating to the aligning of the wafer W can be freely set. Therefore, the wafer W can be carried into each of the vacuum process chambers 91–93 while directing it to any direction.

Still further, centering data relating to the center of the wafer W may be prepared, as wafer alignment data, in addition to or instead of data relating to the ori-fla of the wafer W.

Still further, the cassette chambers 81, 82 and the first transfer chamber 70 are shielded from the outside. Therefore, particles and atmosphere outside can be prevented from entering into the vacuum process chambers 91–93.

Still further, the first transfer chamber 70 is kept equal to atmospheric pressure. Therefore, the wafer W can be more reliably vacuum-sucked by the arm 72, thereby preventing the wafer W from shifting from its predetermined position or falling down from the arm 72.

Although the first transfer chamber 70 has been adjusted to the atmosphere of nitrogen gas, which is equal to or higher than atmospheric pressure, in the above-described case, it may be adjusted to the atmosphere of dry air, argon gas or carbon-dioxide gas which is equal to or higher than atmospheric pressure.

Although semiconductor wafers have been processed in the above case, they may be LCD substrates.

The vaccum process applied to the wafer W includes sputtering, CVD, etching, ashing, oxidizing, diffusing and so on.

The wafer positioner unit 130 is arranged together with the first carrier unit 71 in the first transfer chamber 71. Therefore, the whole of the multi-chamber system can be smaller-sized and a higher throughput can be realized. In addition, the first carrier unit 71 needs no lifter for moving it up and down. It can be thus more easily controlled and it can be made simpler in structure.

Further, the substrate to be processed is positioned to meet the process, which will be applied to the substrate in each of the vacuum process chambers, by the positioner unit. The positioning of the substrate in each of them can be thus made freer.

Additional advantages and modifications will readily occur to those skilled in the art. Therefore, the invention in its broader aspects is not limited to the specific details, and representative devices, and described herein. Accordingly, various modifications may be made without departing from the spirit or scope of the general inventive concept as defined by the appended claims and their equivalents.

What is claimed is:

1. A multi-chamber system for processing a semiconductor substrate having an orientation flat comprising:

cassette chambers into and out of each of which a cassette in which a plurality of substrates are housed is carried under atmosphere pressure;

first substrate carrier means for taking a substrate out of the cassette and returning it into the cassette;

alignment means for detecting a substrate position without contacting said substrate, centering said substrate relative to said first substrate carrier means, and changing the direction of the orientation flat of said substrate;

a first substrate transfer chamber provided with the alignment means and the first substrate carrier means and put under a pressure equal to or higher than atmospheric pressure;

a plurality of load lock chambers, the substrate being carried between each of the load lock chambers and the first substrate transfer chamber by the first substrate carrier means;

a second substrate carrier means for carrying the substrate into and out of the load lock chamber;

a second substrate transfer chamber provided with the second substrate carrier means;

a plurality of vacuum process chambers, said substrate being carried between each of the vacuum process chambers and the second substrate transfer chamber by the second substrate carrier means and processed under a reduced pressure; and means for vertically moving the alignment means in regions including a first level and a second level, said first level being in a first region where the first substrate carrier means is moved in a z-axis direction together with the substrate and said second level being outside said first region.

2. The substrate carrier mechanism according to claim 1, wherein said moving means has a lifter for moving the alignment means up and down.

3. The substrate carrier mechanism according to claim 1, wherein two load lock chambers are located adjacent to the first substrate transfer chamber and said alignment means is located at an equal distance from the two load lock chambers.

4. The substrate carrier mechanism according to claim 1, further comprising control means for storing substrate position data relating to various kinds of process applied to the substrate, selecting a piece of datum from these data to meet a process which will be applied to the substrate, and controlling the alignment means on the basis of the datum selected.

5. The multi-chamber system according to claim 1, wherein pressure in said first chamber is kept to be equal to or higher than an atmospheric pressure.

6. The multi-chamber system according to claim 1, further comprising cassette carrier means for carrying the cassette into and out of each of the cassette chambers, said cassette carrier means including:

a hand on which the cassette is mounted, a multi-joined arm for supporting the hand swingably, and a base for supporting the multi-joined arm swingably;

said multi-joined arm including a first shaft member rotatably attached to the hand, a second shaft member rotatably attached to the base, a third shaft member rotated associating with the first shaft member but in a direction reverse to the direction in which the first shaft member is rotated, a fourth shaft member rotatably attached to the base and to which rotation drive force is transmitted, a first arm rotatably attached to the first shaft member at the front end thereof and to the second shaft member at the base end thereof, and a second arm arranged substantially parallel to the first arm and fixed to the third shaft member at the base end thereof;

thereby when the first and second arms are swung one direction, the hand is swung in other direction reverse to said one direction in which the first and second arms are swung.

7. The multi-chamber system according to claim 1, which further comprises:

means for purging the first substrate transfer chamber and the cassette chamber with nitrogen gas.

8. The multi-chamber system according to claim 1, wherein the first substrate carrier means comprises an arm for holding the substrate by suction.

9. The multi-chamber system according to claim 1, wherein the alignment means comprises a rotation stage for rotating the substrate and an X-Y axis moving mechanism for moving the substrate within an X-Y plane together with the first substrate carrier means.

10. The multi-chamber system according to claim 1, wherein the alignment means comprises a rotation stage for rotating the substrate, an X-Y axis moving mechanism for moving the substrate within an X-Y plane together with the first substrate carrier means, and a laser position detector for optically detecting the position of the substrate on said rotation stage.

* * * * *